United States Patent
Aihara

(10) Patent No.: US 8,640,359 B2
(45) Date of Patent: Feb. 4, 2014

(54) SUBSTRATE TREATING APPARATUS AND SUBSTRATE TREATING METHOD

(75) Inventor: Tomoaki Aihara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1165 days.

(21) Appl. No.: 12/340,235

(22) Filed: Dec. 19, 2008

(65) Prior Publication Data

US 2009/0158613 A1    Jun. 25, 2009

(30) Foreign Application Priority Data

Dec. 20, 2007  (JP) ................. 2007-328927
Jul. 29, 2008   (JP) ................. 2008-194789

(51) Int. Cl.
*F26B 5/04*    (2006.01)
*B08B 7/04*    (2006.01)

(52) U.S. Cl.
USPC ................... 34/409; 34/341; 34/472

(58) Field of Classification Search
USPC ........... 34/341, 565, 569, 567, 337, 409, 559, 34/340, 472, 75, 83, 79; 134/12, 135, 95.2
See application file for complete search history.

(56) References Cited

U.S. PATENT DOCUMENTS

| | | | |
|---|---|---|---|
| 5,716,458 A | 2/1998 | Machino | |
| 5,873,177 A | 2/1999 | Honda et al. | |
| 6,790,291 B2 * | 9/2004 | Kimura | 134/30 |
| 2004/0226582 A1 | 11/2004 | Satoshi et al. | |
| 2006/0021634 A1 * | 2/2006 | Liu et al. | 134/1.3 |

FOREIGN PATENT DOCUMENTS

| | | | | |
|---|---|---|---|---|
| JP | 8-211592 | 8/1996 | | |
| JP | 10-22257 | 1/1998 | | |
| JP | 3585199 | 8/2004 | | |
| JP | 2005-203712 A | * | 7/2005 | ............ H01L 21/027 |
| JP | 2006-59857 | 3/2006 | | |
| JP | 2006-247597 A | * | 9/2006 | ............ B01D 53/44 |
| JP | 2007-214447 | 8/2007 | | |

OTHER PUBLICATIONS

Abstract for Suzuki et al., JP2006-247597A, Sep. 2006.*
Translation for Suzuki et al., JP2006-247597A, Sep. 2006.*
Abstract for Kubo et al., JP2005-203712A, Jul. 2005.*
Translation for Kubo et al., JP2005-203712A, Jul. 2005.*
Notice of Allowance dated Oct. 28, 2011 in connection with corresponding Korean Patent Application No. 10-2008-0125672.

* cited by examiner

*Primary Examiner* — Jiping Lu
(74) *Attorney, Agent, or Firm* — Ostrolenk Faber LLP

(57) ABSTRACT

A substrate treating apparatus for drying substrates with a solvent vapor after treating the substrates with a treating liquid, includes a solvent vapor supply device for supplying the solvent vapor into a treating chamber, an exhaust device for exhausting gas from the chamber through an exhaust pipe, a drain pipe connected to the chamber for draining the treating liquid from the chamber, a gas-liquid separator at the other end of the exhaust pipe for receiving the gas from the exhaust device, and connected to the other end of the drain pipe for receiving the treating liquid from the drain pipe, the gas-liquid separator separating the gas and the liquid, and a mixer mounted on the exhaust pipe for mixing deionized water into the gas exhausted by the exhaust device.

4 Claims, 6 Drawing Sheets

SUBSTRATE TREATING APPARATUS AND SUBSTRATE TREATING METHOD

BACKGROUND OF THE INVENTION (1) Field of the Invention

This invention relates to a substrate treating apparatus and a substrate treating method for treating, such as cleaning and etching with treating liquids or solutions, substrates such as semiconductor wafers or glass substrates for liquid crystal displays (hereinafter called simply substrates), and thereafter drying the substrates with solvent vapor.

(2) Description of the Related Art

A conventional apparatus of this type includes a treating tank for storing deionized water, a chamber enclosing the treating tank, a holding mechanism for vertically moving substrates between a treating position inside the treating tank and a drying position above the treating tank, a vapor generator for generating a vapor of isopropyl alcohol (IPA), nozzles for supplying the vapor of isopropyl alcohol into the chamber, and an exhaust pump for exhausting gas from the chamber (see Japanese Patent No. 3585199, for example).

In the apparatus of such construction, the holding mechanism holding substrates is first moved to the treating position to clean the substrates as immersed in deionized water. Then, a vapor of isopropyl alcohol is supplied from the nozzles to fill the chamber with a solvent atmosphere. Subsequently, the holding mechanism holding the substrates is moved from the treating position to the drying position. Next, the exhaust pump is operated to exhaust gas from and decompress the chamber, and the vapor of isopropyl alcohol adhering to the substrates is dried to dry the substrates.

The conventional apparatus with the above construction has the following drawback.

With an increasingly refined process, the conventional apparatus can have a high concentration of isopropyl alcohol in the vapor supplied into the chamber. In such a case, the concentration of isopropyl alcohol in the exhaust gas from the exhaust pump becomes high, which poses a problem of imposing a load on exhaust equipment (utility) of the user.

SUMMARY OF THE INVENTION

This invention has been made having regard to the state of the art noted above, and its object is provide a substrate treating apparatus and a substrate treating method that can reduce a burden imposed on exhaust equipment by collecting a solvent in exhaust gas to lower the solvent concentration in the exhaust gas.

The above object is fulfilled, according to this invention, by a substrate treating apparatus for drying substrates with a solvent vapor after treating the substrates with a treating liquid, the apparatus comprising a treating tank for storing the treating liquid; a holding device for holding the substrates in the treating tank; a chamber enclosing the treating tank; a solvent vapor supply device for supplying the solvent vapor into the chamber; an exhaust device for exhausting gas from the chamber through an exhaust pipe connected at one end thereof to the chamber; a drain pipe connected at one end thereof to the chamber for draining the treating liquid from the chamber; a gas-liquid separating device having the other end of the exhaust pipe connected thereto for receiving the gas exhausted by the exhaust device, and having the other end of the drain pipe connected thereto for receiving the treating liquid drained through the drain pipe, the gas-liquid separating device separating the gas and the liquid; and a mixing device mounted on the exhaust pipe for mixing deionized water into the gas exhausted by the exhaust device.

According to this invention, the gas exhausted by the exhaust device from the chamber through the exhaust pipe having one end connected to the chamber is mixed with deionized water by the mixing device and fed into the gas-liquid separating device. Even if the solvent vapor is included in the gas exhausted from the chamber, the solvent vapor melts into the deionized water. This reduces the concentration of solvent included in the gas exhausted from the gas-liquid separating device.

In this invention, the mixing device may include a static mixer for mixing the gas and the deionized water, and an injection portion for injecting the deionized water into an upstream position of the static mixer.

By injecting deionized water from the injection portion, the gas exhausted from the chamber and the deionized water are mixed by the static mixer. Thus, the solvent vapor can fully melt into the deionized water. This further reduces the concentration of solvent included in the gas exhausted from the gas-liquid separating device.

In this invention, the apparatus may further comprise a solvent concentration measuring device for measuring a concentration of solvent in the gas-liquid separating device; a control valve for adjusting a flow rate of the deionized water injected to the injection portion; and a control device for controlling the control valve to increase the flow rate of the deionized water when the concentration of the solvent measured by the solvent concentration measuring device is high, and controlling the control valve to decrease the flow rate of the deionized water when the concentration of the solvent measured by the solvent concentration measuring device is low.

The control device controls the control valve to increase the flow rate of the deionized water when the concentration of the solvent measured by the solvent concentration measuring device is high, and controls the control valve to decrease the flow rate of the deionized water when the concentration of the solvent measured by the solvent concentration measuring device is low. Thus, the solvent concentration can be reduced irrespective of variations in the solvent concentration in the gas exhausted from the chamber.

In this invention, the apparatus may further comprise a discharge portion for discharging the gas through a discharge pipe from the gas-liquid separating device; and a liquefying device mounted on the discharge pipe for liquefying the gas discharged from the discharge portion by compressing and cooling the gas.

The liquefying device liquefies the gas discharged from the discharge portion by compressing and cooling the gas. This further reduces the concentration of solvent included in the gas exhausted from the gas-liquid separating device.

In this invention, the liquefying device may include an orifice for narrowing a flow passage through the discharge pipe, and a cooling device for cooling the gas from peripheral surfaces of the orifice, wherein the solvent liquefied by the liquefying device is allowed to flow downstream of the orifice.

The cooling device cools the gas from peripheral surfaces of the orifice, and a solvent liquefied by the cooling device is allowed to flow downstream. Thus, the solvent included in the gas can be liquefied and discharged efficiently.

In this invention, the liquefying device may include a cooling device disposed in a flow passage through the discharge pipe, and a drain pipe disposed downstream of the cooling device, wherein the solvent liquefied by the liquefying device is allowed to flow down through the drain pipe.

The cooling device is disposed in the flow passage through the discharge pipe. This cooling device cools the gas in the discharge pipe, and the solvent liquefied by the liquefying device is allowed to flow down through the drain pipe. Thus, the solvent included in the gas can be liquefied and discharged efficiently.

In another aspect of the invention, a substrate treating method is provided for drying substrates with a solvent vapor after treating the substrates with a treating liquid, the method comprising a step of carrying out chemical treatment of the substrates immersed in treating liquids including a chemical solution stored in a treating tank; a step of decompressing an interior of a chamber enclosing the treating tank, to a predetermined pressure through an exhaust pipe communicating with the chamber; a step of supplying the solvent vapor into the chamber; a step of moving the substrates above the treating tank; a step of resuming decompression of the interior of the chamber through the exhaust pipe, and mixing deionized water into a gas flowing through the exhaust pipe, by a mixing device; and a step of separating and discharging the gas and liquid through a gas-liquid separating device downstream of the mixing device.

After chemical treatment, the substrates are cleaned with deionized water. Subsequently, the interior of the chamber is decompressed and the solvent vapor is supplied into the chamber. In a state of solvent vapor atmosphere formed in the chamber, the substrates are moved up to replace the deionized water adhering to the substrates with the solvent. Then, the decompression is resumed to dry the solvent adhering to the substrates. The gas exhausted from the chamber is mixed with deionized water by the mixing device and fed into the gas-liquid separating device. Even if the solvent vapor is included in the gas exhausted from the chamber, the solvent vapor melts into the deionized water. This reduces the concentration of solvent included in the gas exhausted from the gas-liquid separating device.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of this invention will be described in detail hereinafter with reference to the drawings.

Figure 1:
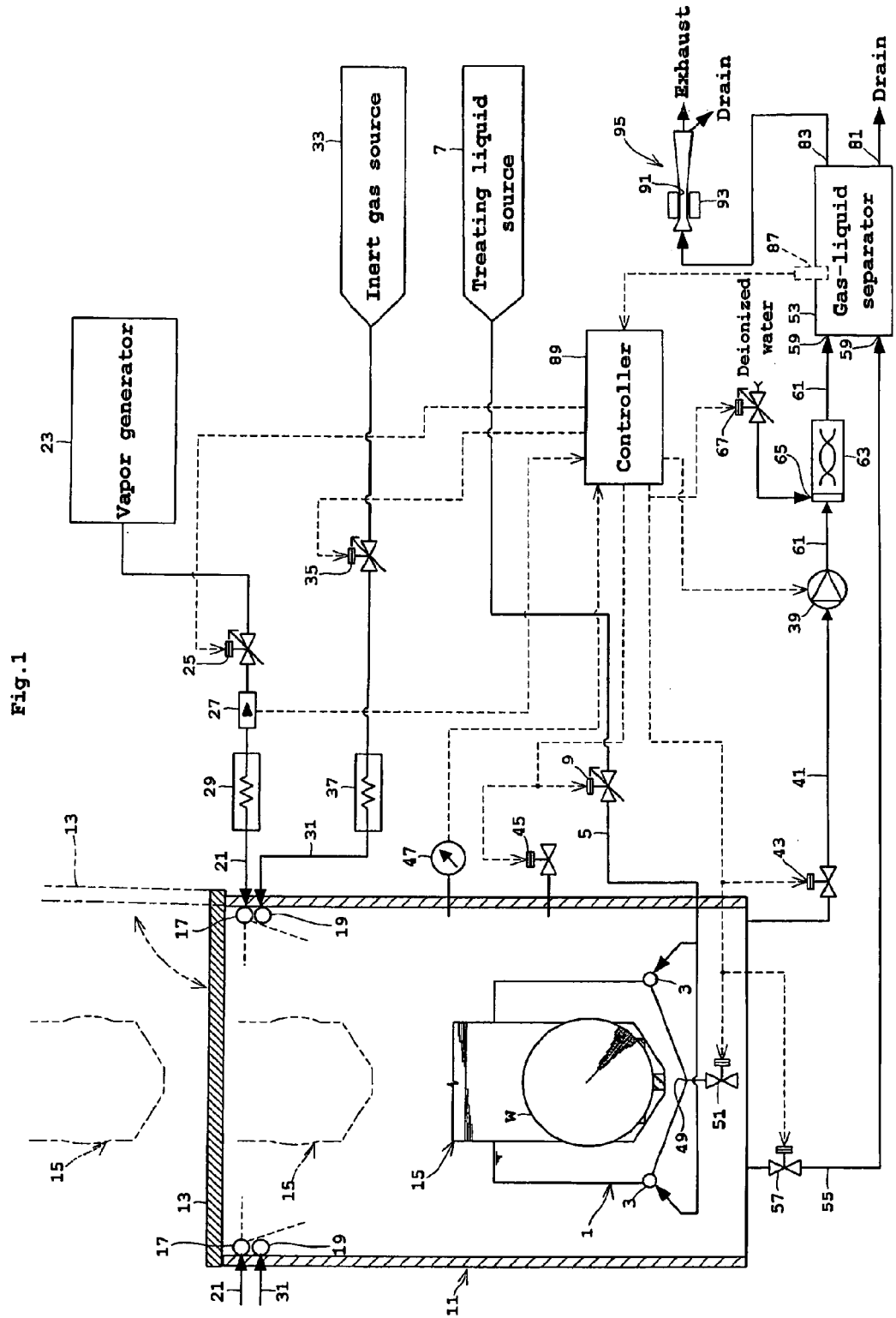
FIG. 1 is a block diagram showing an outline of a substrate treating apparatus according to this invention.

FIG. 1 is a block diagram showing an outline of a substrate treating apparatus according to this invention.

The substrate treating apparatus in this embodiment includes a treating tank 1 for storing a treating liquid or solution. The treating tank 1 storing the treating liquid can receive a plurality of wafers W in upstanding posture. The treating tank 1 has two jet pipes 3 arranged in the bottom thereof for supplying the treating liquid, the jet pipes 3 having long axes extending in a direction of arrangement of the wafers W (i.e. perpendicular to the plane of FIG. 1). Each jet pipe 3 is connected to one end of a supply pipe 5. The other end of the supply pipe 5 is connected to a treating liquid source 7. The flow rate of the treating liquid through the supply pipe 5 is controlled by a treating liquid valve 9 consisting of a control valve.

The treating tank 1 has an upper portion thereof enclosed in a chamber 11. The chamber 11 has an openable top cover 13. A lifter 15 for holding the wafers W in upstanding posture is movable between a "standby position" above the chamber 11, a "treating position" inside the treating tank 1, and a "drying position" above the treating tank 1 and inside the chamber 11.

A pair of solvent nozzles 17 and a pair of inert gas nozzles 19 are arranged under the top cover 13 and on an upper inner wall of the chamber 11. Each solvent nozzle 17 is connected to one end of a feed pipe 21. The other end of the feed pipe 21 is connected to a vapor generator 23. The feed pipe 21 has, arranged thereon from upstream to downstream, a vapor valve 25 consisting of a control valve for adjusting a flow rate of solvent vapor, a flowmeter 27 for detecting a flow rate of solvent vapor, and an in-line heater 29 for heating the solvent vapor. The feed pipe 21 has a larger diameter (about 9.52 mm) than in a conventional apparatus to reduce channel resistance to the solvent vapor in the feed pipe 21, thereby to supply the vapor smoothly from the vapor generator 23 to the solvent nozzles 17.

The vapor generator 23 has a heater (not shown) mounted therein for generating a vapor of solvent by controlling or heating an interior space thereof serving as a vapor generating space to a predetermined temperature, thereby vaporizing the solvent supplied into the interior space. The solvent used herein may be isopropyl alcohol (IPA), for example. Further, the vapor generator 23 has a vacuum pump (not shown) connected thereto for decompressing the interior space.

The solvent nozzles 17 correspond to the "solvent vapor supply device" in this invention.

Each inert gas nozzle 19 is connected to one end of a feed pipe 31. The other end of the feed pipe 31 is connected to an inert gas source 33 for supplying an inert gas. The feed pipe 31 has, arranged thereon from upstream to downstream, an inert gas valve 35 consisting of a control valve for controlling a flow rate, and an in-line heater 37 for heating the inert gas to a predetermined temperature. The inert gas may be nitrogen gas ($N_2$), for example.

A vacuum pump 39 is provided which can discharge liquid even when the interior of chamber 11 is decompressed. One end of an exhaust pipe 41 is connected to a suction side of the vacuum pump 39, while the other end is connected to the bottom of the chamber 11. The exhaust pipe 41 has a vacuum valve 43 mounted thereon for switching operation. The vacuum pump 39, preferably, is a seal water type vacuum pump capable of discharging liquid even in a decompression environment.

The vacuum pump 39 corresponds to the "exhaust device" in this invention.

A breather valve 45 consisting of a switch valve is attached to the chamber 11 for canceling a decompressed state. Further, the chamber 11 has a pressure gauge 47 for detecting internal pressure.

The treating tank 1 has an outlet port 49 formed in the bottom thereof. The outlet port 49 has a QDR valve 51 connected thereto. When the treating liquid in the treating tank 1 is discharged from the QDR valve 51, the treating liquid will once be discharged to the bottom of the chamber 11. A drain pipe 55 connected to a gas-liquid separator 53 is attached to the bottom of the chamber 11. The drain pipe 55 has a drain valve 57 mounted thereon. The gas-liquid separator 53 receives the gas and liquid from the exhaust pipe 41 and drain pipe 55, and separates and discharges the gas and liquid.

While a detailed construction of the gas-liquid separator 53 will be described hereinafter, the gas-liquid separator 53 has intake ports 59 for taking in the gas and liquid. Connected to the intake ports 59 are a downstream end of the drain pipe 55, and a downstream end of an exhaust pipe 61 which receives exhaust gas from the vacuum pump 39.

A static mixer 63 is mounted on the exhaust pipe 61 between the vacuum pump 39 and gas-liquid separator 53. The static mixer 63 has an injection portion 65 disposed in an upstream position thereof for injecting deionized water. A flow control valve 67 controls a flow rate of deionized water to the injection portion 65. As described in detail hereinafter, the static mixer 63 has no actuator, but agitates and mixes fluids successively by action of division, turning and reversal.

The gas-liquid separator 53 corresponds to the "gas-liquid separating device" in this invention. The static mixer 63 corresponds to the "mixing device" in this invention.

Figure 2:
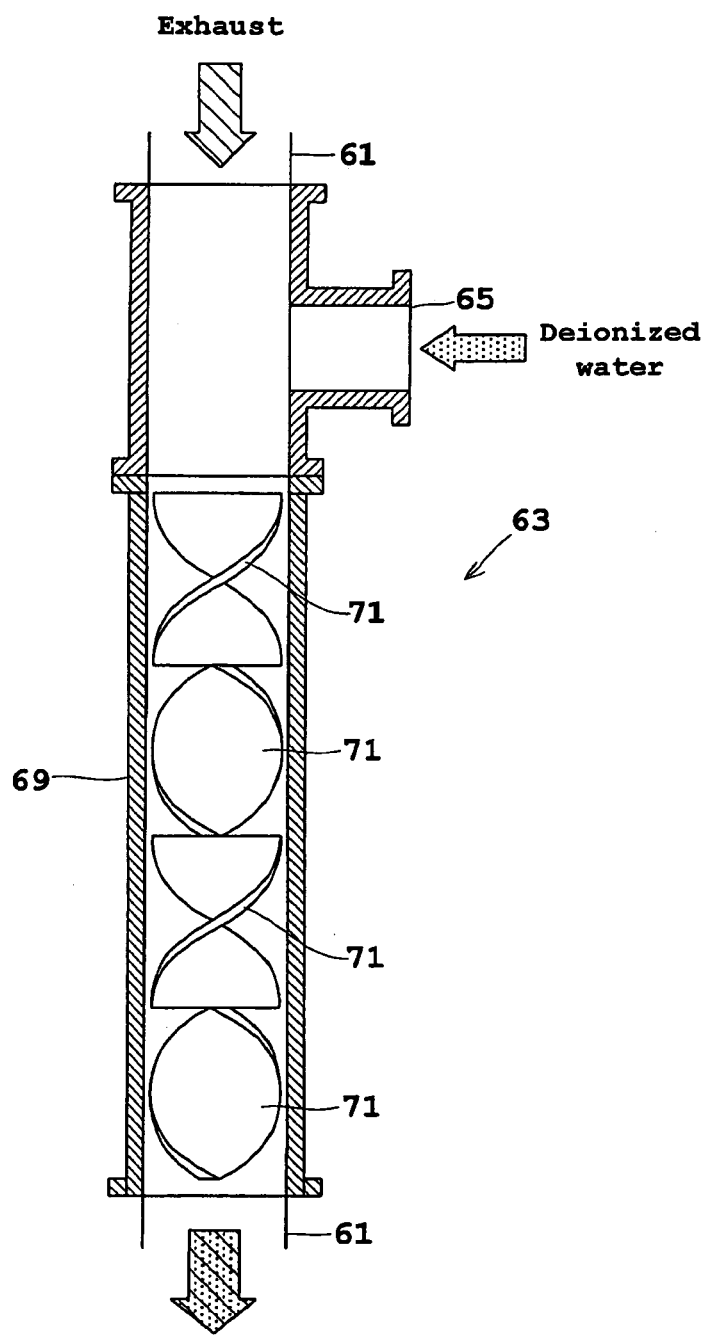
FIG. 2 is a view in vertical section showing an outline of a static mixer.

Next, reference is made to FIG. 2 which is a view in vertical section showing an outline of the static mixer 63.

The static mixer 63 includes a cylindrical body 69 and a plurality of elements 71 arranged in series in the body 69. Each element 71 is in the form of a rectangular plate member twisted 180 degrees. Adjoining elements 71 are twisted in opposite directions. The static mixer 63 has the above-noted injection portion 65 disposed in the upstream position thereof for injecting deionized water into the exhaust gas (including air, nitrogen, solvent vapor, and water vapor) flowing through the exhaust pipe 61, and agitates and mixes the liquid and gas by action of division, turning and reversal. Such mixing action can improve the efficiency of gas and liquid separation by the gas-liquid separator 53.

Figure 3:
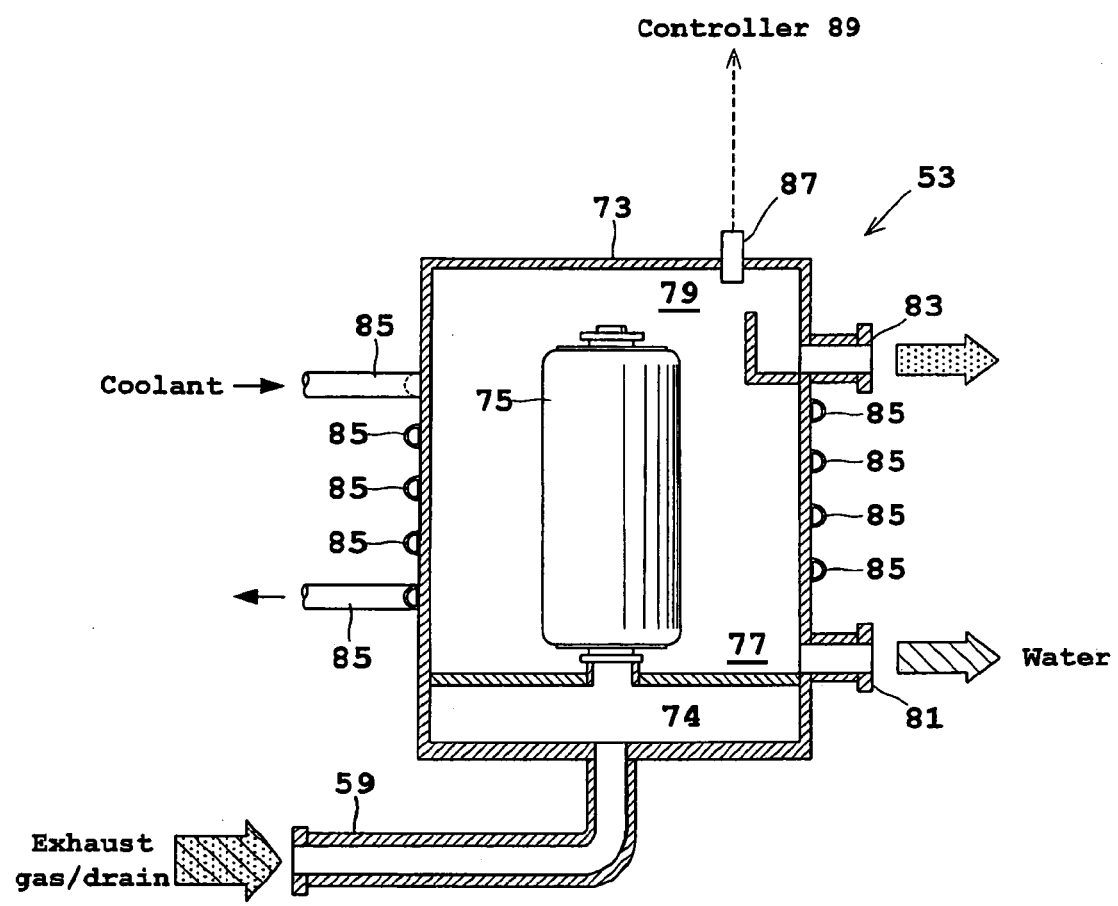
FIG. 3 is a view in vertical section showing an outline of a gas-liquid separator.

Next, reference is made to FIG. 3 which is a view in vertical section showing an outline of the gas-liquid separator 53.

The gas-liquid separator 53 includes a housing 73, an introducing portion 74 in the bottom of the housing 73, a filter 75 for filtering the exhaust gas and liquid from the introducing portion 74, a first storage portion 77 for storing part having a high specific gravity of the substance having passed the filter 75, a second storage portion 79 for storing part having a low specific gravity, the intake ports 59 for taking the gas and liquid into the introducing portion 74, a first discharge portion 81 for discharging the liquid from the first storage portion 77, a second discharge portion 83 for discharging the gas from the second storage portion 79, and a cooling pipe 85 arranged along the outer wall of housing 73 for indirectly cooling the filter 75. The filter 75 is a microfiber filter having a function to trap a differentiated free liquid and flocculate the liquid into coarse masses. The free liquid differentiated to the order of microns is flocculated to the order of millimeters, thereby to be instantaneously distributed into a perfect bilayer system by specific gravity difference. The housing 73 has a concentration meter 87 disposed in an upper position thereof for measuring a solvent concentration in the second storage portion 79.

The cooling pipe 85 cools the filter 75 to a temperature lower than the temperature of the exhaust gas. When, for example, the temperature of the vapor of isopropyl alcohol is 50° C., the filter 75 may be cooled to a temperature below 50° C.

A controller 89, which corresponds to the "control device" in this invention, performs an overall control of the apparatus including the vertical movement of the lifter 15, operation and stopping of the vacuum pump 39, temperature control of the in-line heaters 29 and 37, and opening and closing of the control valves such as treating liquid valve 9, vapor valve 25, inert gas valve 35, vacuum valve 43, breather valve 45, QDR valve 51 and flow control valve 67. The output signals of the pressure gauge 47 and concentration meter 87 are given to the controller 89.

The controller 89 refers to the output signal of the concentration meter 87, operates the flow control valve 67 to increase the deionized water flow rate when the solvent concentration is high, and operates the flow control valve 67 to decrease the deionized water flow rate when the solvent concentration is low. Thus, when the solvent concentration in the exhaust gas is high, deionized water is increased to take in the solvent in the exhaust gas easily, and when the solvent concentration in the exhaust gas is low, deionized water is decreased to reduce consumption of the deionized water. As a result, the solvent concentration is reduced regardless of variations in the solvent concentration in the exhaust gas.

Figure 4:
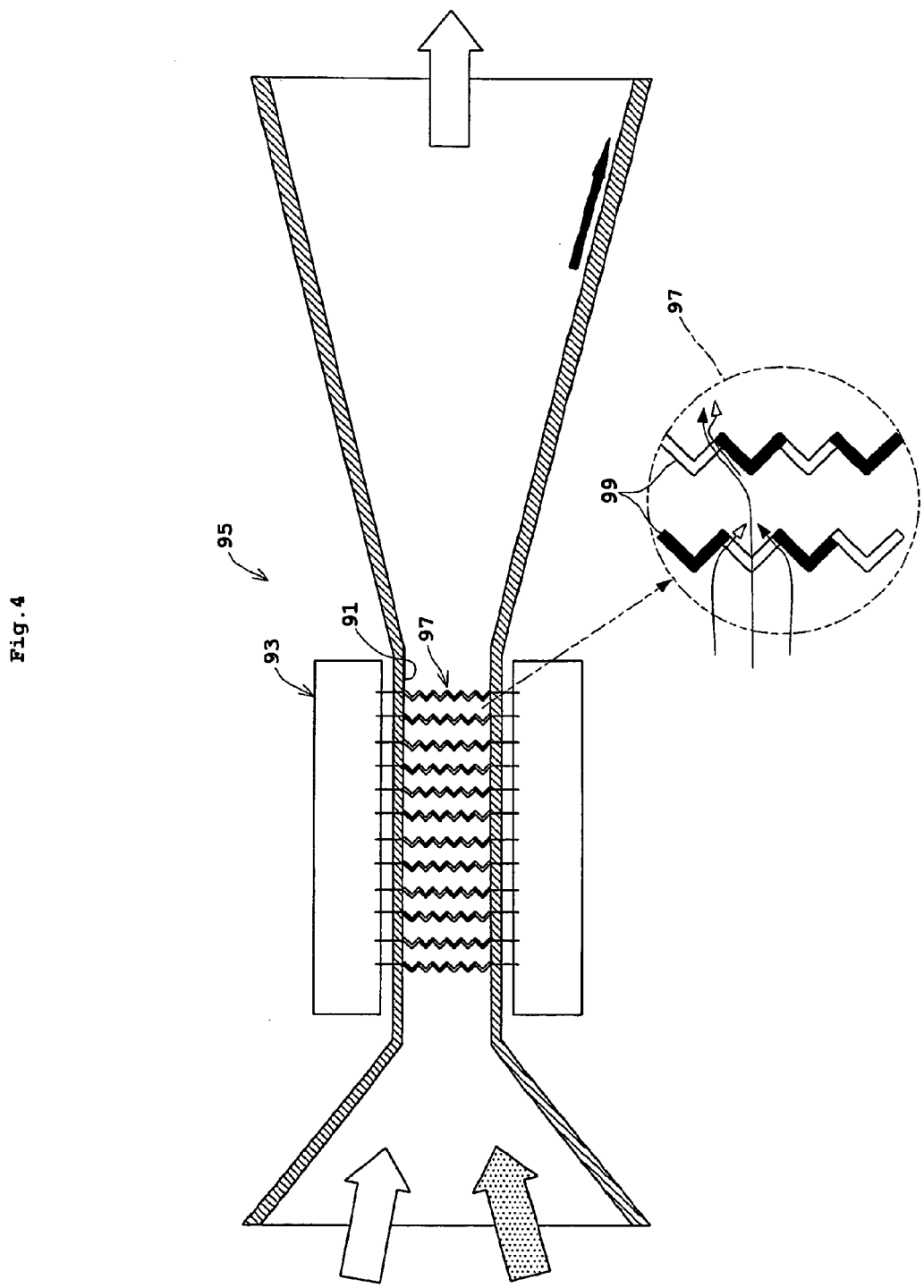
FIG. 4 is a view in vertical section showing an outline of a liquefying unit.

Next, reference is made to FIG. 4 which is a view in vertical section showing an outline of a liquefying unit.

An exhaust pipe of the second exhaust portion 83 includes a liquefying unit 95 having an orifice 91 which narrows the flow passage through the exhaust pipe to a small cross-sectional area, and a cooler 93 mounted peripherally of the orifice 91 for cooling the fluid flowing through the orifice 91. The cooler 93 cools the fluid to a temperature below an exhaust gas temperature. When, for example, the temperature of the vapor of isopropyl alcohol is 50° C., the fluid may be cooled to a temperature below 50° C.

The cooler 93 may, for example, be the type using a Peltier device, or the type that circulates a coolant through a channel. Since the vapor of isopropyl alcohol is included in the gas, the type using a coolant is preferred from the viewpoint of explosion-proof construction.

The orifice 91, preferably, has a cooling member 97 forming a labyrinth structure for increasing an area of contact with the gas. This cooling member 97 includes a plurality of mesh elements 99 each having cooled portions and portions passing the exhaust gas. Adjoining mesh elements 99 are arranged to stagger the portions passing the gas as seen in the direction of passage. Consequently, the gas flows while contacting the cooled portions of at least certain of the mesh elements 99, to realize improved cooling effect.

Figure 5:
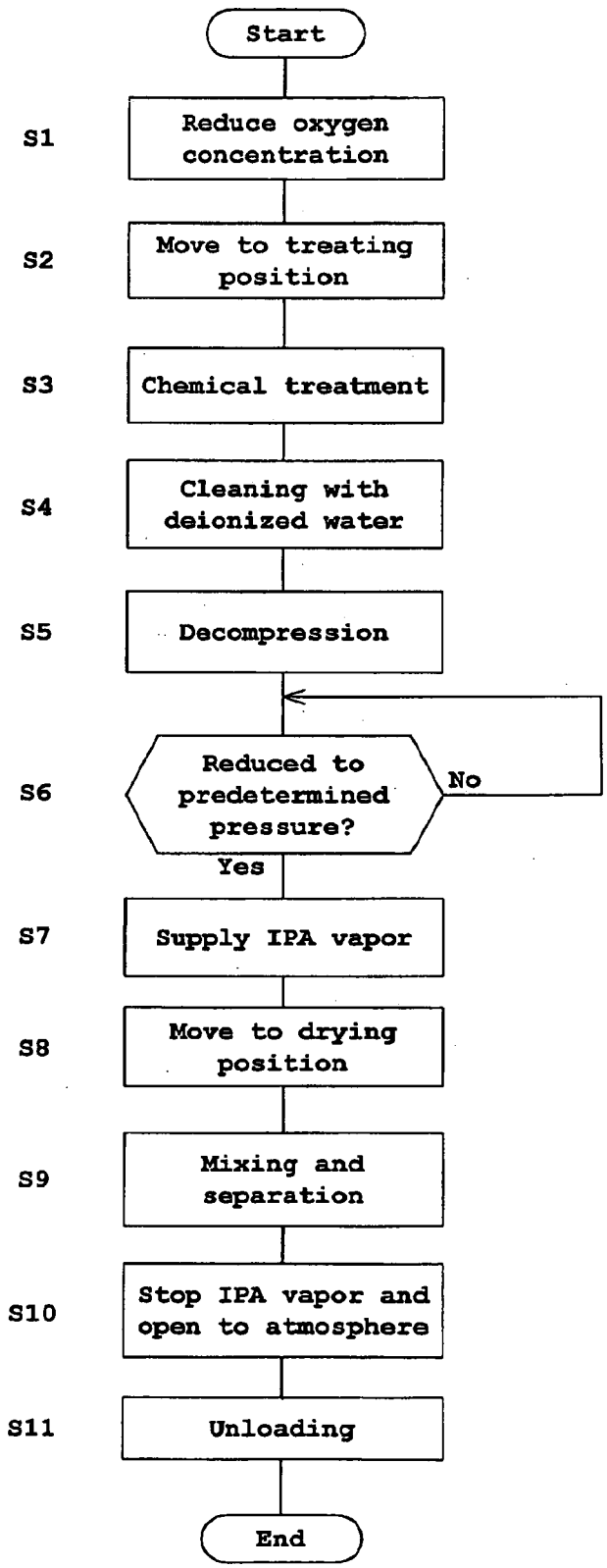
FIG. 5 is a flow chart of operation.

Next, operation of the above apparatus will be described with reference to FIG. 5. FIG. 5 is a flow chart of operation.

Steps S1 and S2

The controller 89 opens the top cover 13, and moves the lifter 15 holding a plurality of wafers W to be treated from the "standby position" to the "drying position" in the chamber 11. At this time, the drain valve 57 is maintained open. Next, the controller 89 reduces the oxygen concentration in the chamber 11. Specifically, the controller 89 opens the inert gas valve 35 to supply the inert gas from the inert gas source 33 through the feed pipe 31 and inert gas nozzles 19 into the chamber 11. Thus, the inert gas purges air in the interior of the chamber 11 and treating tank 1, thereby reducing the oxygen concentration in the chamber 11. Further, the controller 89 lowers the lifter 15 from the "drying position" to the "treating position" in the treating tank 1.

Step S3

The controller 89 opens the treating liquid valve 9. Then, a chemical solution is supplied as the treating solution from the treating liquid source 7 to the treating tank 1, and the treating solution overflowing the treating tank 1 is collected at the bottom of the chamber 11. The collected treating solution is fed through the drain pipe 55 to the gas-liquid separator 53, and is discharged through the first discharge portion 81 to a drain treating device (not shown). This state is maintained for a predetermined time to treat the wafers W with the treating solution.

Step S4

Upon lapse of the predetermined time after start of the chemical treatment, the controller 89 causes deionized water to be supplied as treating liquid to replace the chemical solution from the treating liquid source 7, while maintaining the lifter 15 in the "treating position". This state is maintained for a predetermined time to clean the wafers W with the deionized water.

Steps S5 and S6

Upon completion of the deionized water cleaning treatment, the controller 89 closes the breather valve 45 to block off the interior of chamber 11, and operates the vacuum pump 39 to discharges gas from the chamber 11 to the exhaust pipe 41 to start decompressing the chamber 11. Based on the output signal of the pressure gauge 47, the controller 89 determines whether the interior of the chamber 11 has reduced to a predetermined pressure, and continues the decompression by the vacuum pump 39 until the predetermined pressure is reached.

Step S7

The controller 89 sets the in-line heater 29 to a heating mode for a predetermined temperature, and opens the vapor valve 25 adjusted to a predetermined flow rate. Consequently, the vapor of isopropyl alcohol (IPA) generated in the vapor generator 23 is supplied as heated to the predetermined temperature, through the feed pipe 21 and solvent nozzles 17 into the chamber 11 by pressure difference to the interior of the chamber 11. Since the vapor of isopropyl alcohol is supplied by pressure difference, without using a carrier gas, the vapor of isopropyl alcohol can be supplied in high concentration into the chamber 11.

Step S8

As the vapor of isopropyl alcohol begins to be supplied into the chamber 11 as noted above, the vapor fills the interior of the chamber 11, and the surface of deionized water stored in the treating tank 1 is gradually replaced by the vapor of isopropyl alcohol. After a predetermined time, the controller 89 raises the lifter 15 from the "treating position" to the "drying position".

Step S9

The controller 89 resumes the decompression by the vacuum pump 39, thereby to exhaust, through the exhaust pipe 41, gases in the chamber 11, i.e. nitrogen, the vapor of isopropyl alcohol, and water vapor from waterdrops adhering to the treating tank 1 and chamber 11. Sealing water leaving the sealing water type vacuum pump 39 also flows with the exhaust gas into the exhaust pipe 61. This exhaust gas is agitated and mixed by the static mixer 63 before being fed to the gas-liquid separator 53. Therefore, the vapor of isopropyl alcohol is mixed with deionized water by the gas-liquid separator 53 to be drained in liquid state. This treatment (mixing and separation treatment) continues until the IPA vapor is stopped, or until lapse of a predetermined time after the IPA vapor is stopped.

Consequently, the deionized water adhering to the surfaces of wafers W in the "drying position" is replaced by the vapor of isopropyl alcohol.

Step S10

Next, the controller 89 closes the vapor valve 25, and stops the vacuum pump 39. At this time, the decompression of the chamber 11 is maintained to continue drying the wafers W under reduced pressure. After a predetermined time, the controller 89 opens the inert gas valve 35 to introduce the inert gas from the inert gas nozzles 19 into the chamber 11, and opens the breather valve 45 to return the pressure in the chamber 11 to atmospheric pressure.

Step S11

The controller 89 closes the inert gas valve 35, opens the top cover 13, and raises the lifter 15 from the "drying position" to the "standby position" outside the chamber 11. Then, the controller 89 opens the treating liquid valve 9, drain valve 57 and inert gas valve 35. In this way, a new portion of the treating solution is supplied into the treating tank 1, and the interior of chamber 11 is filled with the inert gas, for treatment of next wafers W.

According to the apparatus in this embodiment, as described above, the exhaust gas is mixed with deionized water by the static mixer 63 even if the vapor of high-concentration isopropyl alcohol is supplied through the solvent nozzles 17 into the chamber 11 surrounding the treating tank 1. Thus, since the exhaust gas, although including the vapor of isopropyl alcohol, is fed to the gas-liquid separator 53 with deionized water, the vapor of isopropyl alcohol is discharged with deionized water. As a result, it is possible to reduce the concentration of isopropyl alcohol in the exhaust gas from the gas-liquid separator 53.

The exhaust gas and deionized water are efficiently mixed in the static mixer 63 by injecting deionized water from the injection portion 65. Thus, isopropyl alcohol in the exhaust gas, the liquid such as deionized water, and the gas are evenly mixable. This increases the accuracy of gas-liquid separation in the gas-liquid separator 53, to further reduce the concentration of isopropyl alcohol in the exhaust gas.

The static mixer 63 acts as the mixing device in this embodiment. Instead, a mixer having a movable portion may be employed.

This embodiment provides the injection portion 65 for mixing deionized water and exhaust gas, and the flow rate of deionized water is adjusted according to the isopropyl alcohol concentration in the gas-liquid separator 73. However, the injection portion 65 and flow control valve 67 may be omitted, so that the mixing action relies simply on the static mixer 63. This simplifies the construction, and lightens the load on the controller 89.

According to this embodiment, the gas discharged from the second exhaust portion 83 of gas-liquid separator 53 is compressed and cooled by the liquefying unit 95. Thus, the vapor of isopropyl alcohol included in the gas is condensed into liquid. Therefore, the vapor of isopropyl alcohol included in the gas is turned into liquid to flow down the liquefying unit 95 (see FIG. 4). The vapor of isopropyl alcohol is discharged as liquid. As a result, the concentration of isopropyl alcohol included in the exhaust gas from the gas-liquid separator 53 can be reduced.

According to this embodiment, the exhaust gas is compressed by the orifice 91, and then cooled by the cooler 93. Thus, the solvent included in the exhaust gas can be condensed efficiently.

Figure 6:
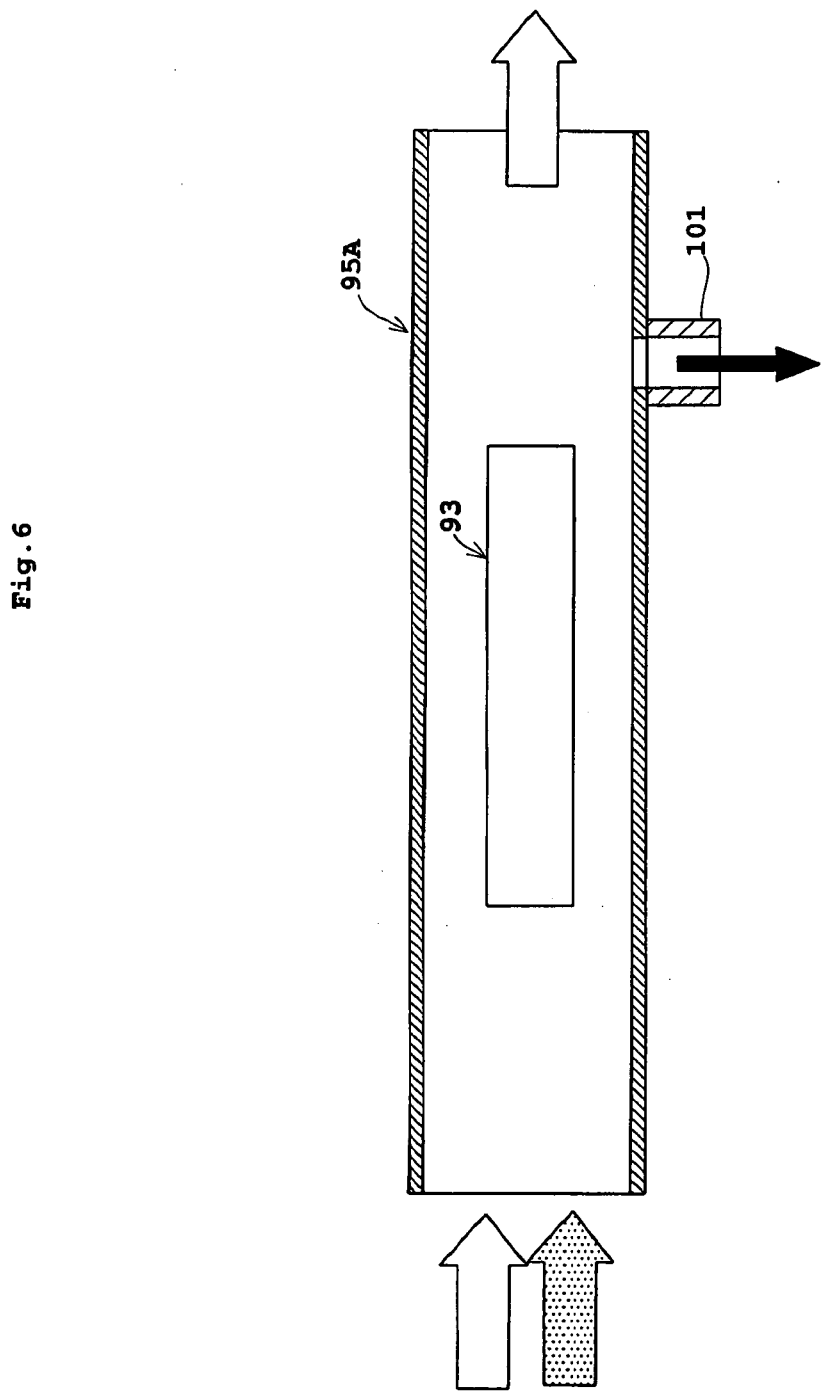
FIG. 6 is a view in vertical section showing an outline of a modified liquefying unit.

The above liquefying unit 95 can be replaced with a liquefying unit 95A as shown in FIG. 6.

Reference is now made to FIG. 6 which is a view in vertical section showing a modified liquefying unit.

This liquefying unit 95A has a cooler 93 mounted in the flow passage of the exhaust pipe from the second exhaust unit 83, and a drain pipe 101 disposed downstream thereof. Although the orifice 91 as in the liquefying unit 95 described hereinbefore is not provided here, the cooler 93 mounted in the flow passage narrows the passage as a result. Thus, the liquefying unit 95A has a function and effect similar to the foregoing liquefying unit 95. The exhaust gas is directly cooled by the cooler 93 to increase liquefying efficiency. The condensed solvent flows down the drain pipe 101 to be discharged.

The above liquefying units 95 and 95A correspond to the "liquefying device" in this invention. The above cooler 93 corresponds to the "cooling device" in this invention.

A blower (pressurizer) may be provided upstream of the liquefying unit 95 (95A) to increase exhaust gas pressure, thereby to promote liquefying effect by compression.

This invention is not limited to the foregoing embodiment, but may be modified as follows:

(1) In the foregoing embodiment, the treating tank 1 has a single tank construction. Instead, a double tank construction may be employed, which includes an inner tank, and an outer tank for collecting the treating liquid or solution overflowing the inner tank.

(2) The foregoing embodiment uses, by way of example, isopropyl alcohol as solvent. This invention is not limited to this solvent. Other solvents may be used to provide similar functions and effects.

(3) The foregoing embodiment provides a construction for supplying nitrogen gas into the chamber 11 to reduce oxygen concentration. This construction is not absolutely necessary.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for drying substrates with a solvent vapor after treating the substrates with a treating liquid, said method comprising:
    a step of carrying out chemical treatment of the substrates immersed in treating liquids including a chemical solution stored in a treating tank;
    a step of carrying out deionized water cleaning of the substrates by immersing the substrates in deionized water in the treating tank;
    a step of decompressing an interior of a chamber enclosing the treating tank, to a predetermined pressure through an exhaust pipe communicating with the chamber;
    a step of supplying the solvent vapor into the chamber;
    a step of moving the substrates above the treating tank;
    a step of resuming decompression of the interior of the chamber through the exhaust pipe, and mixing deionized water into a gas flowing through the exhaust pipe, by a mixing device using a static mixer for mixing the gas and the deionized water and using an injection portion for injecting the deionized water upstream of the static mixer; and
    a step of separating and discharging the gas and liquid through a gas-liquid separating device downstream of the mixing device, through a gas-liquid separating device having a gas-liquid separating filter, a cooling pipe for cooling the filter, a first discharge portion for discharging the liquid separated, and a second discharge portion for discharging the gas separated, while increasing a flow rate of the deionized water when a solvent concentration in the gas-liquid separating device is high, and decreasing said flow rate when the solvent concentration in the gas-liquid separating device is low.

2. The method according to claim 1, further comprising a step, executed after the separating and discharging step, for compressing and cooling, with a liquefying device, the gas discharged from the gas-liquid separating device.

3. The method according to claim 2, wherein the liquefying device causes the gas discharged from the gas-liquid separating device to flow through an orifice defining a narrowed flow passage, cools the gas from peripheral surfaces of the orifice, and allows the solvent liquefied to flow downstream of the orifice.

4. The method according to claim 2, wherein the liquefying device cools, in a flow passage, the gas discharged from the gas-liquid separating device, and allows the solvent liquefied to flow downstream.

* * * * *